(12) United States Patent
Tzu et al.

(10) Patent No.: US 6,921,967 B2
(45) Date of Patent: Jul. 26, 2005

(54) REINFORCED DIE PAD SUPPORT STRUCTURE

(75) Inventors: Chung-Hsing Tzu, Chung-Ho (TW);
Jun-Chun Shih, Jubei (TW);
Kuang-Yang Chen, Hu-Kuo Hsiang (TW); Kuo-Chang Tan, Nantz (TW);
Hsi-Hsun Ho, Lungtan Shiang (TW);
June-Wen Liao, Pingjen (TW);
Ching-Huai Wang, Chu-Tung (TW)

(73) Assignee: Amkor Technology, Inc., Chandler, AZ (US)

( * ) Notice: Subject to any disclaimer, the term of this patent is extended or adjusted under 35 U.S.C. 154(b) by 69 days.

(21) Appl. No.: 10/669,820

(22) Filed: Sep. 24, 2003

(65) Prior Publication Data

US 2005/0062139 A1 Mar. 24, 2005

(51) Int. Cl.[7] .............................................. H01L 23/495
(52) U.S. Cl. ..................... 257/676; 257/666; 257/670; 257/782; 257/787; 257/788
(58) Field of Search ................................ 257/666–677, 257/779–784, 787–796

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |

(Continued)

FOREIGN PATENT DOCUMENTS

| | | |
|---|---|---|
| DE | 19734794 A1 | 8/1997 |
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 098968 | 3/2000 |
| EP | 1032037 | 8/2000 |

(Continued)

*Primary Examiner*—Andy Huynh
(74) *Attorney, Agent, or Firm*—Stetina Brunda Garred & Brucker

(57) ABSTRACT

A semiconductor package comprising a die pad defining opposed top and bottom surfaces and a peripheral edge. Attached to the peripheral edge of the die pad is a plurality of support feet which extend downwardly relative to the bottom surface thereof. A plurality of leads extend at least partially about the peripheral edge of the die pad in spaced relation thereto. Attached to the top surface of the die pad is a semiconductor die which is electrically connected to at least one of the leads. A package body encapsulates the die pad, the support feet, the leads and the semiconductor die such that at least portions of the leads are exposed in the package body.

20 Claims, 3 Drawing Sheets

U.S. PATENT DOCUMENTS

| | | |
|---|---|---|
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,912,546 A * | 3/1990 | Fujita ........................ 257/676 |
| 4,920,074 A | 4/1990 | Shimizu et al. |
| 4,935,803 A | 6/1990 | Kalfus et al. |
| 4,942,454 A | 7/1990 | Mori et al. |
| 4,984,059 A * | 1/1991 | Kubota et al. ............. 257/676 |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,397,915 A * | 3/1995 | Nose ........................ 257/676 |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,654,585 A * | 8/1997 | Nishikawa ................ 257/666 |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,028,350 A * | 2/2000 | Sabyeying ................. 257/670 |
| 6,031,279 A | 2/2000 | Lenz |
| RE36,613 E | 3/2000 | Ball |
| 6,034,423 A | 3/2000 | Mostafazadeh |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,473 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |

| | | |
|---|---|---|
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 * | 8/2001 | Glenn et al. ............... 257/684 |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,476,469 B2 * | 11/2002 | Hung et al. ............... 257/676 |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,559,525 B2 | 5/2003 | Huang |
| 6,566,168 B2 | 5/2003 | Gang |
| 6,633,077 B2 * | 10/2003 | Ogata et al. ............... 257/676 |
| 2001/0008305 A1 | 7/2001 | McLellan et al. |
| 2001/0011654 A1 | 8/2001 | Kimura |
| 2001/0014538 A1 | 8/2001 | Kwan et al. |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |

FOREIGN PATENT DOCUMENTS

| | | |
|---|---|---|
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63067762 | 3/1988 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10022447 | 1/1998 |
| JP | 10163401 | 6/1998 |
| JP | 10199934 | 7/1998 |
| JP | 10256240 | 9/1998 |
| JP | 00150765 | 5/2000 |
| JP | 556398 | 10/2000 |
| JP | 2001060648 | 3/2001 |
| JP | 200204397 | 8/2002 |
| KR | 941979 | 1/1994 |
| KR | 9772358 | 11/1997 |
| KR | 100220154 | 6/1999 |
| KR | 0049944 | 6/2002 |
| WO | 9956316 | 11/1999 |
| WO | 9967821 | 12/1999 |

* cited by examiner

REINFORCED DIE PAD SUPPORT STRUCTURE

CROSS-REFERENCE TO RELATED APPLICATIONS

Not Applicable.

STATEMENT RE: FEDERALLY SPONSORED RESEARCH/DEVELOPMENT

Not Applicable.

BACKGROUND OF THE INVENTION

The present invention relates generally to semiconductor packages and, more particularly, to a semiconductor package leadframe which includes support feet sized and configured to provide structural support to the die pad of the leadframe.

Integrated circuit dies are conventionally enclosed in plastic packages that provide protection from hostile environments and enable electrical interconnection between the die and an underlying substrate such as a printed circuit board (PCB) or motherboard. The elements of such a package include a metal leadframe, a semiconductor die, bonding material to attach the die to the leadframe, bond wires which electrically connect pads or terminals on the die to individual leads of the leadframe, and a hard plastic encapsulant material which covers the other components and forms the exterior of the semiconductor package often referred to as the package body.

The leadframe is the central supporting structure of the semiconductor package. A portion of the leadframe is internal to the semiconductor package, i.e., completely surrounded by the plastic encapsulant forming the package body. Portions of the leads of the leadframe extend externally from the package body or are partially exposed therein for use in electrically connecting the semiconductor package to another component. In certain semiconductor packages, the die pad is downset or vertically recessed relative to portions of the leads which protrude from the package body of the semiconductor package.

To fabricate semiconductor packages, a current industry practice is to etch or stamp a thin sheet of metal to form a leadframe. The semiconductor die is mounted and wire bonded to the leadframe, with the encapsulant material forming the package body then being applied to encapsulate the die, bond wires, and portions of the leadframe in the above-described manner. Upon the hardening of the encapsulant material and resultant formation of the package body, portions of the leadframe are cut or singulated for purposes of electrically isolating the individual leads of the semiconductor package from each other.

In the fabrication of certain semiconductor packages, a molding procedure is conducted wherein the leadframe having the die wire bonded thereto is placed into the mold cavity of a mold, the mold cavity having the configuration of the fully formed package body of the semiconductor package. A molding compound is injected into the mold cavity of the mold, with the curing or solidification of the molding compound facilitating the formation of the package body of the semiconductor package, as indicated above. In the aforementioned molding process, a hydraulic press including upper and lower mold sections which collectively define the mold cavity is often used. Subsequent to the placement of the leadframe having the die wire bonded thereto into the mold cavity, pre-heated molding compound (e.g., epoxy resin) is injected into the gate of the mold, with the molding compound thereafter being transferred into the mold cavity for application to the leadframe and die wire bonded thereto.

As indicated above, in certain semiconductor packages such as Thin Quad Flat Package (TQFP) products, the die pad of the leadframe is downset relative to outer portions of the leads which protrude from the package body. The downset of the die pad causes the same to extend along a plane which is disposed in spaced, generally parallel relation to the plane along which the outer portions of the leads extend. Certain semiconductor packages such as Quad Flat Pack (QFP) products include a leadframe with a downset die pad and, when completed, have an overall thickness in the range of from about two to four mm. Due to this thickness, there is typically enough space defined between the die pad of the leadframe and the upper and lower sections of the mold such that the molding process is not affected by the spatial separation between the die pad and those surfaces of the upper and lower mold sections which collectively define the mold cavity.

There is an increasing demand in the electronics industry for QFP products including TQFP products of substantially reduced thickness (e.g., one mm or forty mils). The desired thickness reductions in semiconductor packages such as QFP and TQFP products which include a downset die pad often adversely affects the molding process used to form the package body of the semiconductor package. As indicated above, a typical TQFP product has a total thickness of approximately one mm or forty mils. Thus, when the leadframe having the die wire bonded thereto is placed into the mold cavity to facilitate the formation of the package body, the distance separating the die from the surface of the upper mold section partially defining the cavity is about 0.25 mm (about 10 mils), with the distance separating the die pad from the surface of the lower mold section partially defining the mold cavity being only about 0.2 mm (8 mils). The molding compound being filled into the mold cavity via the gate of the mold will flow above the semiconductor die and below the die pad. However, due to the downset of the die pad and the very small gap defined between the die pad and the lower mold section, the molding compound cannot easily flow beneath the die pad. On the other hand, the molding compound can easily flow rapidly above the die pad and the die mounted thereto because of the substantially greater space or distance separating the die from the upper mold section. As a result, the molding process becomes "unbalanced" due to the disparities in the pressure conditions existing above and below the die pad of the leadframe. As a result of this unbalanced state, the support bar of the leadframe which supports the die pad is pressed down by the pressure and weight of the molding compound flowing above the die pad. This downward pressure and weight often results in the die pad and possibly a portion of the lower surface of the die being exposed within the completed package body of the semiconductor package, thus making the semiconductor package unusable. The downward pressure applied to the die pad, though not necessarily resulting in the exposure of the die pad within the package body, sometimes results in poor adhesion between the package body and the die pad, and resultant delamination or separation of the package body from the die pad.

The present invention addresses and alleviates the above-described problems in making thin semiconductor packages including the leadframes with downset die pads by providing support feet on the die pad of the leadframe which prevent excessive movement of the die pad within the mold cavity during the molding operation used to form the package body of the semiconductor package. These and other features of the present invention will be described in more detail below.

BRIEF SUMMARY OF THE INVENTION

In accordance with the present invention, there is provided a leadframe design which provides a reinforced die pad support structure configured to enhance yield and reliability of a semiconductor package or product manufactured through the use of the leadframe. More particularly, the die pad of the leadframe is outfitted with support feet sized and configured to prevent movement of the die pad within a mold cavity as could otherwise result due to disparities in the pressure conditions existing above and below the downset die pad upon the flow of molding compound into the mold cavity.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
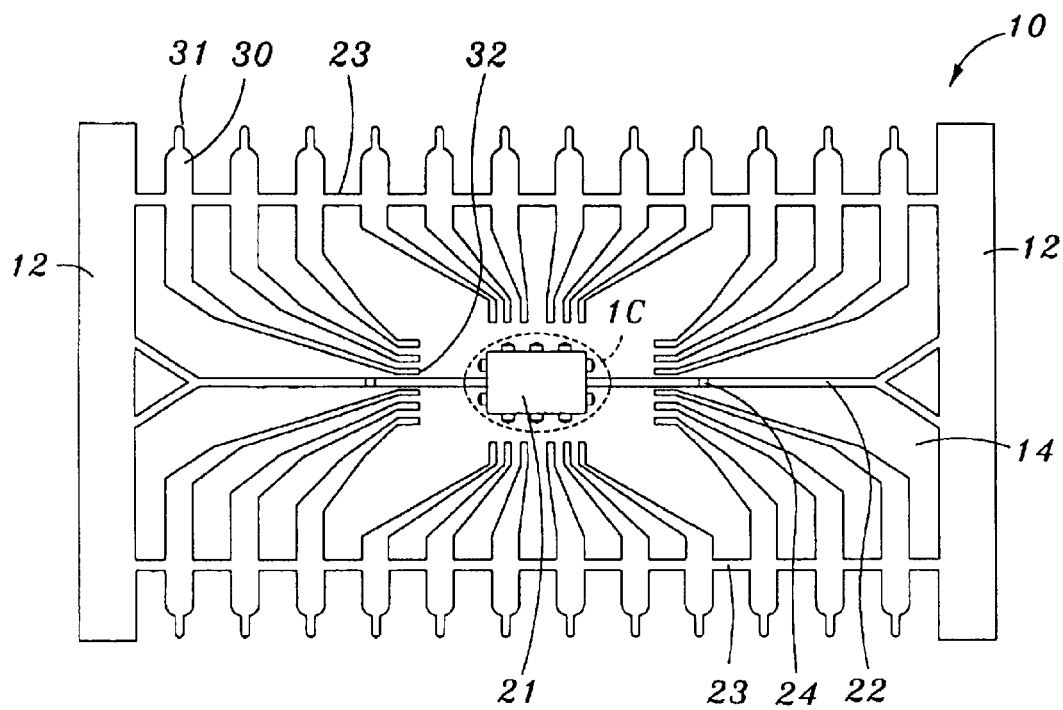
FIG. 1A is a top plan view of a leadframe including a reinforced die pad support structure constructed in accordance with a first embodiment of the present invention.

Referring now to the drawings wherein the showings are for purposes of illustrating preferred embodiments of the present invention only, and not for purposes of limiting the same, FIG. 1A illustrates a leadframe 10 including a reinforced die pad support structure constructed in accordance with a first embodiment of the present invention. The leadframe 10 comprises a pair of outer support rails 12 which extend in spaced, generally parallel relation to each other. Attached to and extending perpendicularly between the support rails 12 in spaced, generally parallel relation to each other is a pair of outer support bars 23. Integrally connected to the outer support bars 23 are a plurality of leads 30 which are supported by the outer support bars 23. Each of the leads 30 includes an inner lead portion 32 which defines the inner end thereof, and an opposed, outer lead portion 31 which defines the outer end thereof. The outer lead portions 31 of the leads 30 are interconnected by the outer support bars 23, with the inner lead portions 32 being disposed in a generally rectangularly configured opening or space 14 collectively defined by the support rails 12 and outer support bars 23.

The leadframe 10 further comprises a generally quadrangular die pad 21 which is itself disposed within the approximate center of the opening 14. The die pad 21 is supported within the opening 14 by a pair of inner support bars 22. The inner ends of the inner support bars 22 are attached to and extend perpendicularly from respective ones of the opposed lateral sides defined by the die pad 21. Each of the inner support bars 22 transitions into a generally V-shaped outer portion, the outer ends of the prongs of which are attached to a respective one of the support rails 12. In the leadframe 10, the inner lead portions 32 of the leads 30 are positioned so as to extend along and in spaced relation to respective ones of the longitudinal and lateral sides of the die pad 21. Those of ordinary skill in the art will recognize that if the die pad 21 were generally square as opposed to rectangular as shown in FIG. 1A, the inner lead portions 32 of the leads 30 would be positioned to extend along and in spaced relation to respective ones of the four equally sized peripheral edge segments defined by the die pad 21.

In the leadframe 10, it is contemplated that the die pad 21 will be "downset" relative to the support rails 12 and outer support bars 23 of the leadframe 10. In this regard, each of the inner support bars 23 is formed to include a downset 24 therein. Similarly, each of the leads 30 is formed to include a downset therein such that the inner lead portions 32 which are disposed in close proximity to the die pad 21 are downset relative to the outer lead portions 31 which, as indicated above, are interconnected by the outer support bars 23. Thus, in the leadframe 10, the die pad 21 and inner lead portions 32 of the leads 30 extend in generally co-planar relation to each other along a common first plane, while the support rails 12, outer support bars 23, and outer lead portions 31 extend in generally co-planar relation to each other along a common second plane which itself extends in spaced, generally parallel relation to the first plane.

Figure 1B:
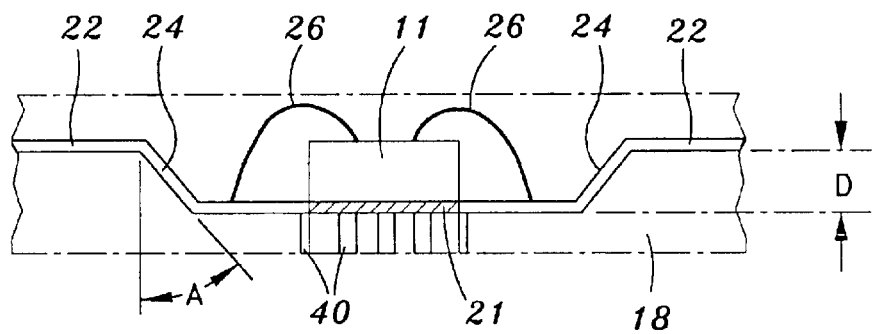
FIG. 1B is a partial cross-sectional view of the leadframe shown in FIG. 1A, illustrating a semiconductor die mounted to the die pad thereof and a portion of the package body in phantom.
Figure 1C:
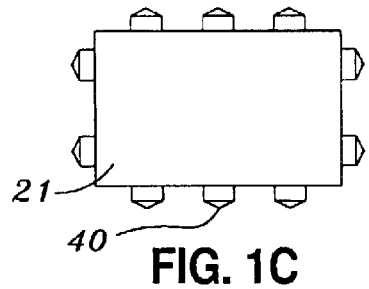
FIG. 1C is an enlargement of the encircled region IC shown in FIG. 1A.

The leadframe 10 constructed in accordance with the present invention is configured to reduce the occurrences of die pad exposure or delamination described above as a result of the unbalanced pressure and weight condition which may occur in the mold cavity as a result of the flow of molding compound about the downset die pad 21 when the leadframe 10 (having a semiconductor die 11 mounted and electrically connected thereto) is inserted into the mold cavity. To prevent any movement of the die pad 21 in the mold cavity during the molding procedure, the leadframe 10 is preferably provided with a plurality of elongate, generally rectangular support feet 40 which are integrally connected to the longitudinal and lateral peripheral sides of the die pad 21 and protrude perpendicularly therefrom. As shown in FIG. 1A, three support feet 40 are attached to each of the longitudinal sides of the die pad 21, with the three support feet 40 of each set being arranged in generally equidistantly spaced relation to each other. Two support feet 40 are attached to and extend from each of the lateral sides of the die pad 21, the two support feet 40 of each set being arranged on opposed sides of the corresponding inner support bar 22. FIGS. 1A, 1B, and 1C each depict the support feet 40 in a final, bent state wherein they extend generally perpendicularly relative to the bottom surface of the die pad 21. As will be recognized, in their initial, unbent state, the support feet 40 extend perpendicularly from respective ones of the longitudinal and lateral sides or peripheral edge segments of the die pad 21, as indicated above.

In manufacturing a semiconductor package utilizing the leadframe 10, the initial step of the manufacturing process involves the formation of the leadframe 10. Such formation is typically accomplished by chemically etching or mechanically stamping a sheet of metallic material (e.g., copper). Subsequent to such chemical etching or mechanical stamping, the inner support bars 22 and leads 30 are subjected to a bending operation for purposes of facilitating the formation of the above-described downsets 24 within the inner support bars 22 and the corresponding downsets within the leads 30. Thereafter, the support feet 40 are each bent in the manner shown in FIGS. 1A, 1B and 1C. The semiconductor die 11 is then mounted to the top surface of the die pad 21, the bent support feet 40 extending generally perpendicularly downward relative to the opposed bottom surface thereof. After the die 111 has been mounted to the die pad 21, pads or terminals of the die 11 are electrically connected to the inner lead portions 32 of respective ones of the leads 30 through the use of conductive bond wires 26. Those of ordinary skill in the art will recognize that the bending of the support feet 40 may occur subsequent to the mounting and electrical connection of the die 11 to the leadframe 10 in the above-described manner.

After the die 11 has been mounted and electrically connected to the leadframe 10 and the support feet 40 bent in the above-described manner, the leadframe 10 and die 11 mounted and electrically connected thereto are placed into the mold cavity of the mold. Despite the unbalanced state that may exist in the mold cavity upon the flow of the molding compound thereinto attributable to the downset of the die pad 21, downward movement of the die pad 21 toward the lower mold section is prevented by the support feet 40 which effectively extend between the lower mold section and the die pad 21. Thus, any bending of the inner support bars 22 which may otherwise result in the lower surface of the die pad 21 being exposed in the completely formed package body of the semiconductor package subsequent to the completion of the molding process is effectively eliminated.

Upon the completion of the molding process, the package body 18 of the semiconductor package is removed from within the mold cavity. Protruding from the package body 18 are the outer lead portions 31 of the leads 30, the outer support bars 23 interconnecting the outer lead portions 31, portions of the inner support bars 22, and the support rails 12 attached to the inner and outer support bars 22, 23. The exposed portions of the inner support bars 22 and support rails 12 are singulated or removed from the package body 18, as are the outer support bars 23. The removal of the outer support bars 23 effectively separates the outer lead portions 31, thus in turn electrically isolating the leads 30 from each other. The inner lead portions 32 of the leads 30 are covered or encapsulated by the package body 18, as are the die pad 21, support feet 40, die 11 and wires 26. If significant downward pressure is applied to the die pad 21 of the leadframe 10 during the molding operation, the possibility exists that the bottom, distal ends of the support feet 40 may be exposed in the bottom surface of the package body 18 of the semiconductor package. More typically, however, the completion of the molding operation will result in the complete encapsulation of the support feet 40 within the package body 18.

Those of ordinary skill in the art will recognize that the configuration of the leadframe 10 shown in FIGS. 1A, 1B and 1C is exemplary only, in that the number and pattern of leads 30 may be varied according to the desired application for the completed semiconductor package. Additionally, the size, number and arrangement of support feet 40 may also be varied from the size and arrangement shown in FIGS. 1A, 1B and 1C. As indicated above, the die pad 21 may alternatively have a square or other configuration as an alternative to the rectangular configuration shown in FIG. 1A. Besides being used in relation to TQFP and fine-pitch TQFP products, the leadframe 10 including the support feet 40 is also suitable for use in low-profile QFP, thin plastic QFP, TSOP (Thin Small Outline Package) and Ultra-Thin Small Outline Package products. Additionally, it is further contemplated that the depth D of the downset 24 in each inner support bar 22 and the angle A of each downset 24 may be varied according to the size of the die 11, and the overall structure of the leadframe 10 based on the particular product in which it is to be used. The support feet 40 may also be bent downwardly to extend at an angle of less than ninety degrees relative to the bottom surface of the die pad 21. The variability in the downsets 24 of the inner support bars 22 is also applicable to the corresponding downsets included in each of the leads 30.

Figure 2A:
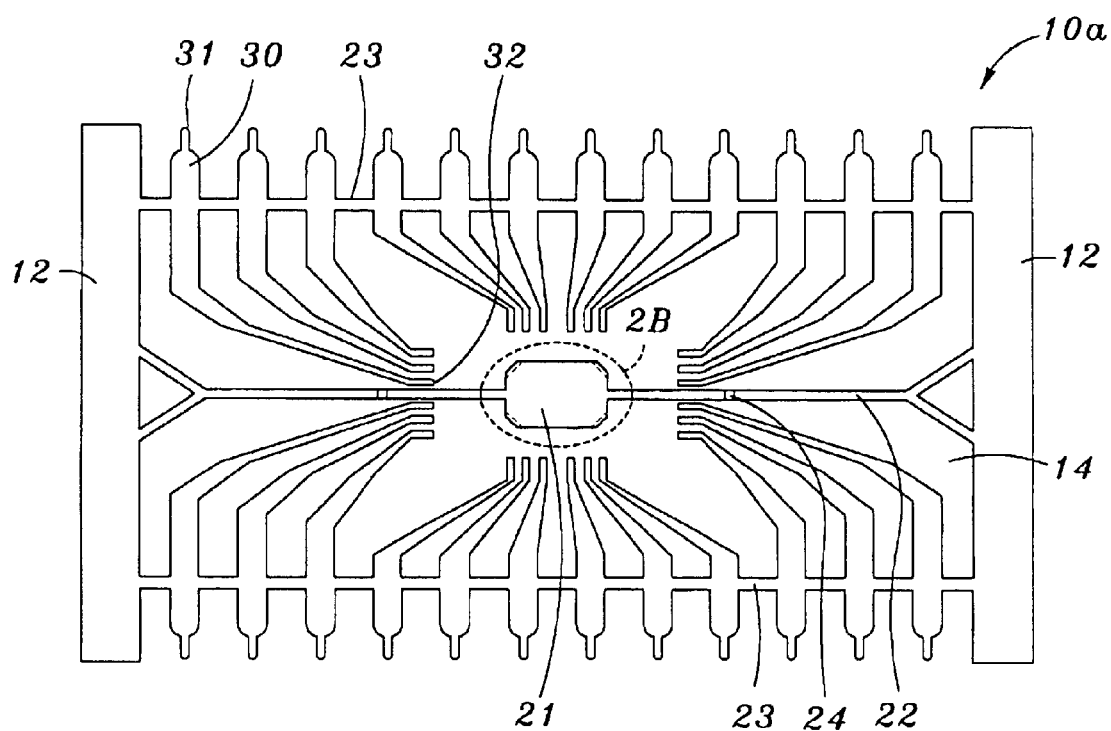
FIG. 2A is a top plan view of a leadframe including a reinforced die pad support structure constructed in accordance with a second embodiment of the present invention.
Figure 2B:
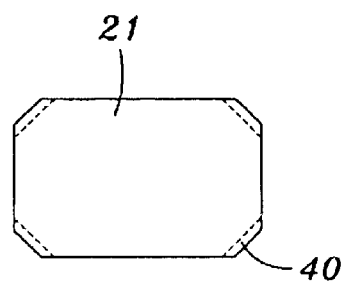
FIG. 2B is an enlargement of the encircled region 2B shown in FIG. 2A.

Referring now to FIGS. 2A and 2B, there is shown a leadframe 10a constructed in accordance with a second embodiment of the present invention. The leadframe 10a is substantially similar in structure to the above-described leadframe 10, except that the support feet 40 of the leadframe 10a extend from respective ones of the four corner regions defined by the die pad 21, as opposed to extending perpendicularly from the longitudinal and lateral sides of the die pad 21 as in the leadframe 10. Thus, in the leadframe 10a, a total of four support feet 40 are included with the die pad 21, as compared to the ten support feet 40 shown as included with the die pad 21 in the leadframe 10. The extension of the support feet 40 from the corner regions of the die pad 21 as occurs in the leadframe 10a will typically be employed in those instances when the number and concentration of leads 30 is such that insufficient spaces or gaps exist between the longitudinal and lateral sides of the die pad 21 and the inner lead portions 32 of the leads 30 as is needed to accommodate the extension of the support feet 40 from the longitudinal and lateral sides of the die pad 21. Thus, in the alternative configuration of the leadframe 10a shown in FIGS. 2A and 2B, the support feet 40 extend into those spaces or gaps defined between each of the four sets of inner lead portions 32 of the leads 30 which extend along respective ones of the lateral and longitudinal sides of the die pad 21.

Figure 3A:
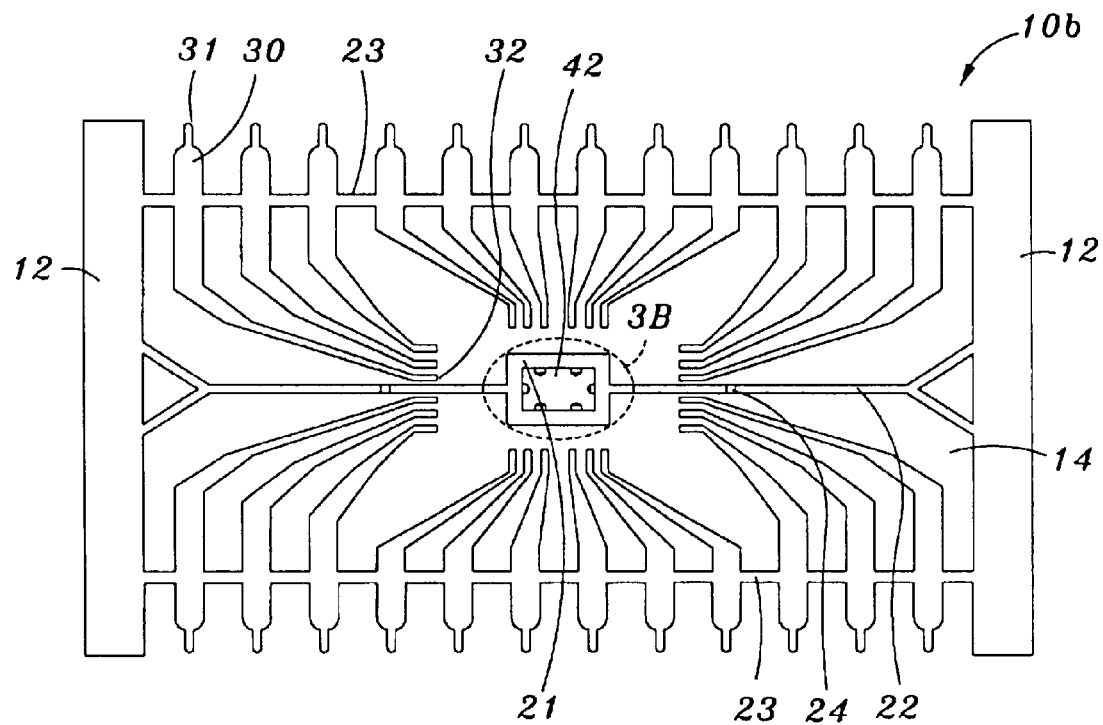
FIG. 3A is a top plan view of a leadframe including a reinforced die pad support structure constructed in accordance with a third embodiment of this present invention.
Figure 3B:
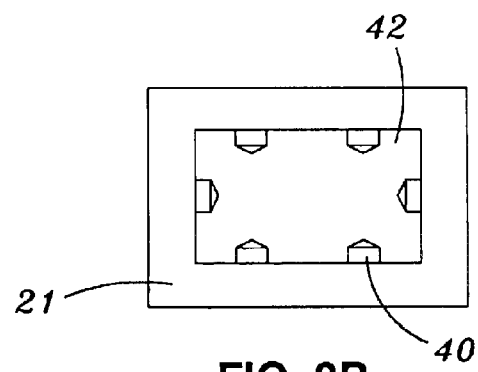
FIG. 3B is an enlargement of the encircled region 3B shown in FIG. 3A.

Referring now to FIGS. 3A and 3B, there is shown a leadframe 10b constructed in accordance with a third embodiment of the present invention. As shown in FIGS. 3A and 3B, the die pad 21 of the leadframe 10b is formed as a rectangularly configured frame defining a central opening 42. The support feet 40 extend perpendicularly from the lateral and longitudinal peripheral edge segments of the die pad 21 into the interior of the opening 42 defined thereby. In FIGS. 3A and 3B, the support feet 40 are shown in their final, bent state wherein they extend generally perpendicularly downward from the bottom surface of the die pad 21. The formation of the die pad 21 as a rectangular frame having the inboard support feet 40 as included in the leadframe 11b is typically employed in those instances when the concentration and spacing of the inner lead portions 32 of the leads 30 about the periphery of the die pad 21 is such that insufficient space is provided to allow for any extension of the support feet 40 perpendicularly outward from the longitudinal and/or lateral sides of the die pad 21. The six support feet 40 shown in FIGS. 3A and 3B is also exemplary only, in that greater or fewer support feet 40 can be included in the leadframe 10b. The configuration of the leadframe 10b is often well suited for use in fine pitch TQFP products.

It is contemplated that the support feet 40 included in the leadframes 10, 10a and 10b may all be formed to include pointed bottom or distal ends, thus minimizing any exposure of the support feet 40 in the bottom surface of the package body of the completely formed semiconductor package. Those of ordinary skill in the art will recognize that the alternatively configured leadframes 10a and 10b may also be used in a wide variety of differing applications as discussed above in relation to the leadframe 10. In this regard, the various structural variants described in relation to the leadframe 10 are also applicable to the leadframes 10a, 10b.

This disclosure provides exemplary embodiments of the present invention. The scope of the present invention is not limited by these exemplary embodiments. Numerous variations, whether explicitly provided for by the specification or implied by the specification, such as variation in structure, dimension, type of material and manufacturing process may be implemented by one of skill in the art in view of this disclosure.

What is claimed is:

1. A semiconductor package, comprising:
   a die pad defining opposed top and bottom surfaces and a peripheral edge;
   a plurality of support feet attached to the peripheral edge of the die pad and extending downwardly relative to the bottom surface thereof;
   a plurality of leads extending at least partially about the peripheral edge of the die pad in spaced relation thereto;
   a semiconductor die attached to the top surface of the die pad and electrically connected to at least one of the leads; and
   a package body encapsulating the die pad, the support feet, the leads and the semiconductor die such that at least portions of the leads are exposed in the package body.

2. The semiconductor package of claim 1 wherein the support feet extend generally perpendicularly relative to the bottom surface of the die pad.

3. The semiconductor package of claim 1 wherein each of the support feet defines a pointed distal end.

4. The semiconductor package of claim 1 wherein:
   each of the leads defines an inner lead portion which is covered by the package body and an outer lead portion which protrudes from the package body;
   the die pad and the inner lead portions of the leads extend in generally co-planar relation to each other along a common die pad plane; and
   the outer lead portions of the leads extend in generally co-planar relation to each other along a common lead plane which is disposed in spaced, generally parallel relation to the die pad plane.

5. The semiconductor package of claim 1 wherein:
   the die pad has a generally rectangular configuration defining an opposed pair of longitudinal sides and an opposed pair of lateral sides; and
   the support feet are attached to each of the longitudinal and lateral sides of the die pad.

6. The semiconductor package of claim 1 wherein:
   the die pad has a generally quadrangular configuration defining four corner regions; and
   the support feet are attached to respective ones of the corner regions defined by the die pad.

7. The semiconductor package of claim 1 further comprising:
   a pair of inner support bars attached to and extending from the peripheral edge of the die pad, the inner support bars being at least partially covered by the package body.

8. The semiconductor package of claim 1 wherein the semiconductor die is electrically connected to at least one of the leads via a conductive wire.

9. A lead frame for use in a semiconductor package, the leadframe comprising:
   a die pad defining opposed top and bottom surfaces and a peripheral edge;
   a plurality of support feet attached to the peripheral edge of the die pad and extending generally perpendicularly therefrom;
   a plurality of leads extending at least partially about the peripheral edge of the die pad in spaced relation thereto;
   at least one outer support bar attached to and extending between the leads in a manner interconnecting the leads to each other; and
   a pair of inner support bars attached to and extending between the outer support bar and the peripheral edge of the die pad.

10. The leadframe of claim 9 wherein:
    each of the leads includes an inner lead portion and an outer lead portion, the outer support bar being attached to and extending between the outer lead portions of the leads; and
    each of the leads and each of the inner support bars includes a downset therein such that the die pad and the inner lead portions extend in generally co-planar relation to each other along a common die pad plane and the outer lead portions and the outer support bar extend in generally co-planar relation to each other along a common lead plane which is disposed in spaced, generally parallel relation to the die pad plane.

11. The leadframe of claim 9 wherein each of the support feet defines a pointed distal end.

12. The leadframe of claim 9 wherein:
    the die pad has a generally rectangular configuration defining an opposed pair of longitudinal sides and an opposed pair of lateral sides; and
    the support feet are attached to each of the longitudinal and lateral sides of the die pad.

13. The leadframe of claim 9 wherein:
    the die pad has a generally quadrangular configuration defining four corner regions; and
    the support feet are attached to respective ones of the corner regions defined by the die pad.

14. A semiconductor package, comprising:
    a die pad including a plurality of peripheral frame segments which each define opposed top and bottom surfaces and collectively define a central opening;
    a plurality of support feet attached to at least some of the frame segments of the die pad, the support feet being disposed within the central opening and extending downwardly relative to the bottom surfaces of the frame segments;
    a plurality of leads extending at least partially about the die pad in spaced relation thereto;

a semiconductor die attached to the top surfaces of at least some of the frame segments of the die pad and electrically connected to at least one of the leads; and a package body encapsulating the die pad, the support feet, the leads and the semiconductor die such that at least portions of the leads are exposed in the package body.

15. The semiconductor package of claim 14 wherein the support feet extend generally perpendicularly relative to the bottom surfaces of the frame segments of the die pad.

16. The semiconductor package of claim 14 wherein each of the support feet defines a pointed distal end.

17. The semiconductor package of claim 14 wherein:

each of the leads defines an inner lead portion which is covered by the package body and an outer lead portion which protrudes from the package body;

the die pad and the inner lead portions of the leads extend in generally co-planar relation to each other along a common die pad plane; and the outer lead portions of the leads extend in generally co-planar relation to each other along a common lead plane which is disposed in spaced, generally parallel relation to the die pad plane.

18. The semiconductor package of claim 14 wherein:

the die pad has a generally rectangular configuration defining an opposed pair of longitudinal frame segments and an opposed pair of lateral frame segments; and the support feet are attached to each of the longitudinal and lateral frame segments of the die pad.

19. The semiconductor package of claim 14 further comprising:

a pair of inner support bars attached to and extending from at least two of the frame segments of the die pad, the inner support bars being at least partially covered by the package body.

20. The semiconductor package of claim 14 wherein the semiconductor die is electrically connected to at least one of the leads via a conductive wire.

* * * * *